United States Patent
Tsai et al.

(10) Patent No.: US 7,772,897 B2
(45) Date of Patent: Aug. 10, 2010

(54) SWITCHED-CAPACITOR CHARGE PUMP DEVICE FOR GENERATION OF OUTPUT DIRECT-CURRENT VOLTAGE WITH WIDE AMPLITUDE RANGE

(75) Inventors: Zuo-Min Tsai, Taipei (TW); Sebastian Hoppner, Taipei (TW); Huie Wang, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/390,681

(22) Filed: Feb. 23, 2009

(65) Prior Publication Data

US 2010/0073049 A1 Mar. 25, 2010

(30) Foreign Application Priority Data

Sep. 23, 2008 (TW) .............................. 97136409 A

(51) Int. Cl.
H03L 7/06 (2006.01)
(52) U.S. Cl. ........................................ 327/157; 327/148
(58) Field of Classification Search ................. 327/148, 327/157
See application file for complete search history.

(56) References Cited

U.S. PATENT DOCUMENTS

| | | | |
|---|---|---|---|
| 6,727,735 B2 * | 4/2004 | Park ........................... 327/157 |
| 7,511,580 B2 * | 3/2009 | Hung ........................... 331/16 |
| 2008/0122505 A1 * | 5/2008 | Wu ............................. 327/157 |
| 2008/0169850 A1 * | 7/2008 | Rombach ..................... 327/157 |
| 2009/0039929 A1 * | 2/2009 | Kossel ......................... 327/157 |
| 2009/0174441 A1 * | 7/2009 | Gebara et al. ............... 327/115 |

* cited by examiner

*Primary Examiner*—Lincoln Donovan
*Assistant Examiner*—Adam D Houston
(74) *Attorney, Agent, or Firm*—Peter F. Corless; Steven M. Jensen; Edwards Angell Palmer & Dodge LLP

(57) ABSTRACT

A switched-capacitor charge pump device is proposed, which is designed for integration to a circuit system, such as a PLL (phase-locked loop) circuit system, for generation of an output direct-current (DC) voltage with a wide amplitude range; and which is characterized by the utilization of two switched-capacitor circuit units in addition to the output capacitor circuit and the utilization of an output voltage comparing circuit (such as a Schmitt trigger) for comparing the end-result output DC voltage against a half-amplitude drive voltage such that when the switched-capacitor circuit units are subjected to a charging-discharging action for voltage pump-up or pump down operations, the switched-capacitor circuit units are switched between a full-amplitude drive voltage and a half-amplitude drive voltage. This feature allows the invention to provide an output DC voltage with a wider amplitude range than prior art.

20 Claims, 7 Drawing Sheets

SWITCHED-CAPACITOR CHARGE PUMP DEVICE FOR GENERATION OF OUTPUT DIRECT-CURRENT VOLTAGE WITH WIDE AMPLITUDE RANGE

BACKGROUND OF THE INVENTION

1. Field of the Invention

This invention relates to electronic circuit technology, and more particularly, to a switched-capacitor charge pump device which is designed for integration to a circuit system, such as a PLL (phase-locked loop) circuit system, for generation of an output direct-current (DC) voltage with a wide amplitude range.

2. Description of Related Art

In PLL (phase-locked loop) and DLL (delay-locked loop) circuitry, the charge pump is an essential circuit component which is capable of being driven by a pair of phase-difference signals (which respectively indicate the lagging or leading of the output frequency generated by the PLL or DLL circuitry with respect to a reference frequency) and responsively generating an output of a DC voltage whose amplitude is proportional to the phase difference between the output frequency and the reference frequency. Fundamentally, the lagging of the output frequency against the reference frequency will result in a negative phase-difference signal which is presented as a pump-up enable signal (UP) to the charge pump; whereas the leading of the output frequency will result in a positive phase-difference signal which is presented as a pump-down enable signal (DN) to the charge pump. The output of the charge pump is a DC voltage which is used as a control voltage for a VCO (voltage-controlled oscillation) unit in PLL circuitry or a VCDL (voltage-controlled delay line) unit in DLL circuitry for adjusting the output frequency to match in phase with the reference frequency.

Theoretically, the output frequency range of a PLL-VCO circuit is proportional to the amplitude range of the input control voltage, i.e., the amplitude range of the DC output of the charge pump. Accordingly, if we want to increase the PLL-VCO output frequency range, this can be achieved simply by increasing the amplitude range of the DC output of the charge pump.

In practice, however, traditional charge pump circuits are only capable of offering a limited amplitude range of DC output; and therefore, the PLL-VCO circuits are also only capable of offering a limited range of frequency output in proportion to the voltage output of the charge pump. For instance, the charge pump circuitry constructed using a 90 nanometer CMOS technology of nowadays can only provide an output DC voltage with an amplitude range from 0.3 V to 0.7 V, i.e., an amplitude span of only 0.4 V, at 1V supply.

Moreover, traditional charge bump circuits are typically constructed on a circuit architecture that includes both a PMOS-based current source and an NMOS-based current source. One drawback to the use of two different MOS types of current sources in the same charge pump circuit architecture is that it would result in a mismatch in electrical characteristics between the two different types of current sources and thus result in a poor electrical performance.

SUMMARY OF THE INVENTION

It is therefore an objective of this invention to provide a switched-capacitor charge pump device which can generate an output DC voltage with a wider amplitude range than the prior art.

It is another objective of this invention to provide a switched-capacitor charge pump device which can be implemented without using current sources of different MOS types for the purpose of preventing the problem of a mismatch in electrical characteristics between the two different types of current sources as in the case of prior art.

The switched-capacitor charge pump device according to the invention is designed for integration to a circuit system, such as a PLL (phase-locked loop) or a DLL (delay-locked loop) circuit system, for generation of an output direct-current (DC) voltage with a wide amplitude range.

In circuit architecture, the switched-capacitor charge pump device of the invention comprises: (A) a first frequency divider and a second frequency divider; (B) an output voltage comparing circuit; (C) a first switch control unit and a second switch control unit; (D) a first switched-capacitor circuit and a second switched-capacitor circuit; and (E) an output capacitor circuit.

The switched-capacitor charge pump device according to the invention is characterized by the utilization of two switched-capacitor circuit units in addition to the output capacitor circuit and the utilization of an output voltage comparing circuit (such as a Schmitt trigger) for comparing the end-result output DC voltage against a half-amplitude drive voltage such that when the switched-capacitor circuit units are subjected to a charging-discharging action for voltage pump-up or pump down operations, the switched-capacitor circuit units are switched between a full-amplitude drive voltage ($V_{dd}$) and a half-amplitude drive voltage $V_{dd/2}$. This feature allows the invention to provide an output DC voltage with a wider amplitude range than prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The switched-capacitor charge pump device according to the invention is disclosed in full details by way of preferred embodiments in the following with reference to the accompanying drawings.

APPLICATION OF THE INVENTION

Figure 1:
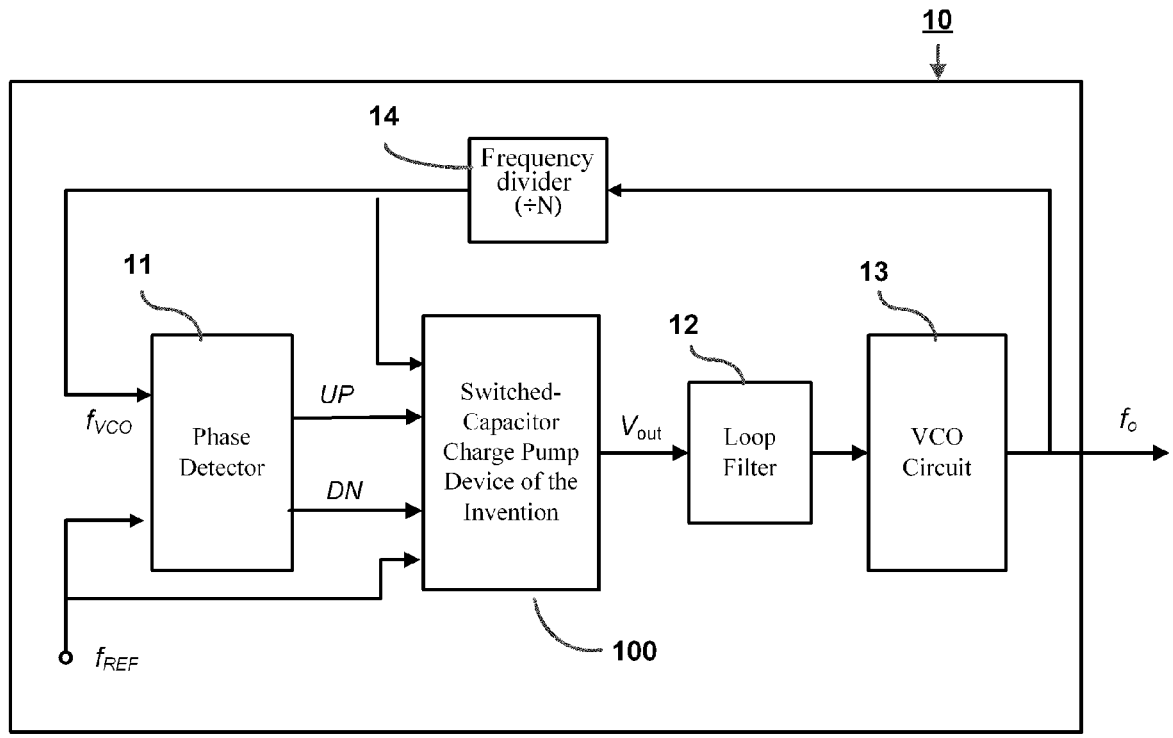
FIG. 1 is a schematic diagram showing a practical application example of the switched-capacitor charge pump device of the invention.

FIG. 1 shows an application example of the switched-capacitor charge pump device of the invention 100. As shown, in this application example, the switched-capacitor charge pump device of the invention 100 is used as a circuit component for integration to a PLL (phase-locked loop) circuit system 10 which additionally includes a phase detector 11, a loop filter 12, a VCO (voltage-controlled oscillation) circuit 13, and a frequency divider 14. Since PLL is a well known and widely used circuit technology in the electronics industry, detailed description thereof will not be given in this specification.

Beside the application with PLL circuit systems, the switched-capacitor charge pump device of the invention 100 can also be used for integration to a DLL (delay-locked loop) circuit system.

FUNCTION OF THE INVENTION

Figure 2:
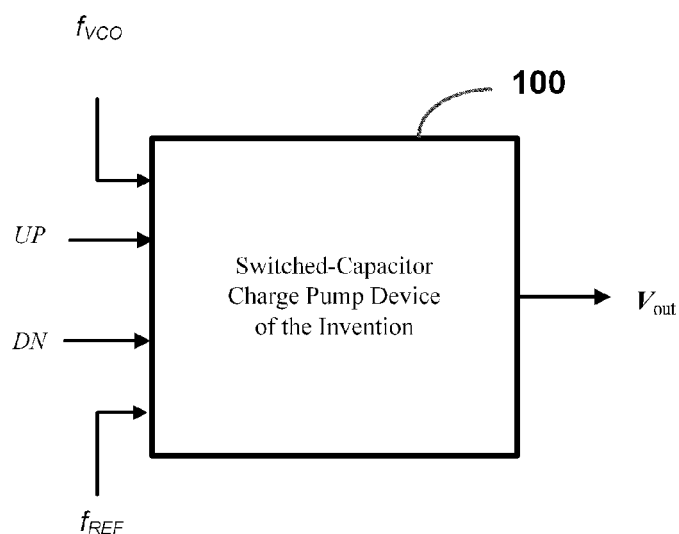
FIG. 2 is a schematic diagram showing the I/O functional model of the switched-capacitor charge pump device of the invention.

FIG. 2 is a schematic diagram showing the I/O (input/output) functional model of the switched-capacitor charge pump device of the invention 100. As shown, the switched-capacitor charge pump device of the invention 100 is designed with an I/O interface having an input interface for reception of the following signals: (UP, DN) and ($f_{VCO}$, $f_{REF}$); where $f_{VCO}$ is a divide-by-N feedback of the output frequency signal $f_o$ of the PLL circuit system 10; $f_{REF}$ is a reference signal; and UP and DN are respectively a pump-up enable signal and a pump-down enable signal generated by the phase detector 11 in response to the phase difference between $f_{VCO}$ and $f_{REF}$.

In operation, the switched-capacitor charge pump device of the invention 100 is capable of responding to the input of (UP, DN) and ($f_{VCO}$, $f_{REF}$) by generating an output DC voltage $V_{out}$ whose amplitude will be pumped up to a higher level at the presence of the pump-up enable signal (UP) and pumped down to a lower level at the presence of the pump-down enable signal (DN). In the application with the PLL circuit system 10, the output DC voltage $V_{out}$ is transferred via the loop filter 12 to the VCO circuit 13 for use as a control voltage for the VCO circuit 13 to adjust its output oscillating signal $f_o$ to match in phase with the reference signal $f_{REF}$.

ARCHITECTURE OF THE INVENTION

Figure 3:
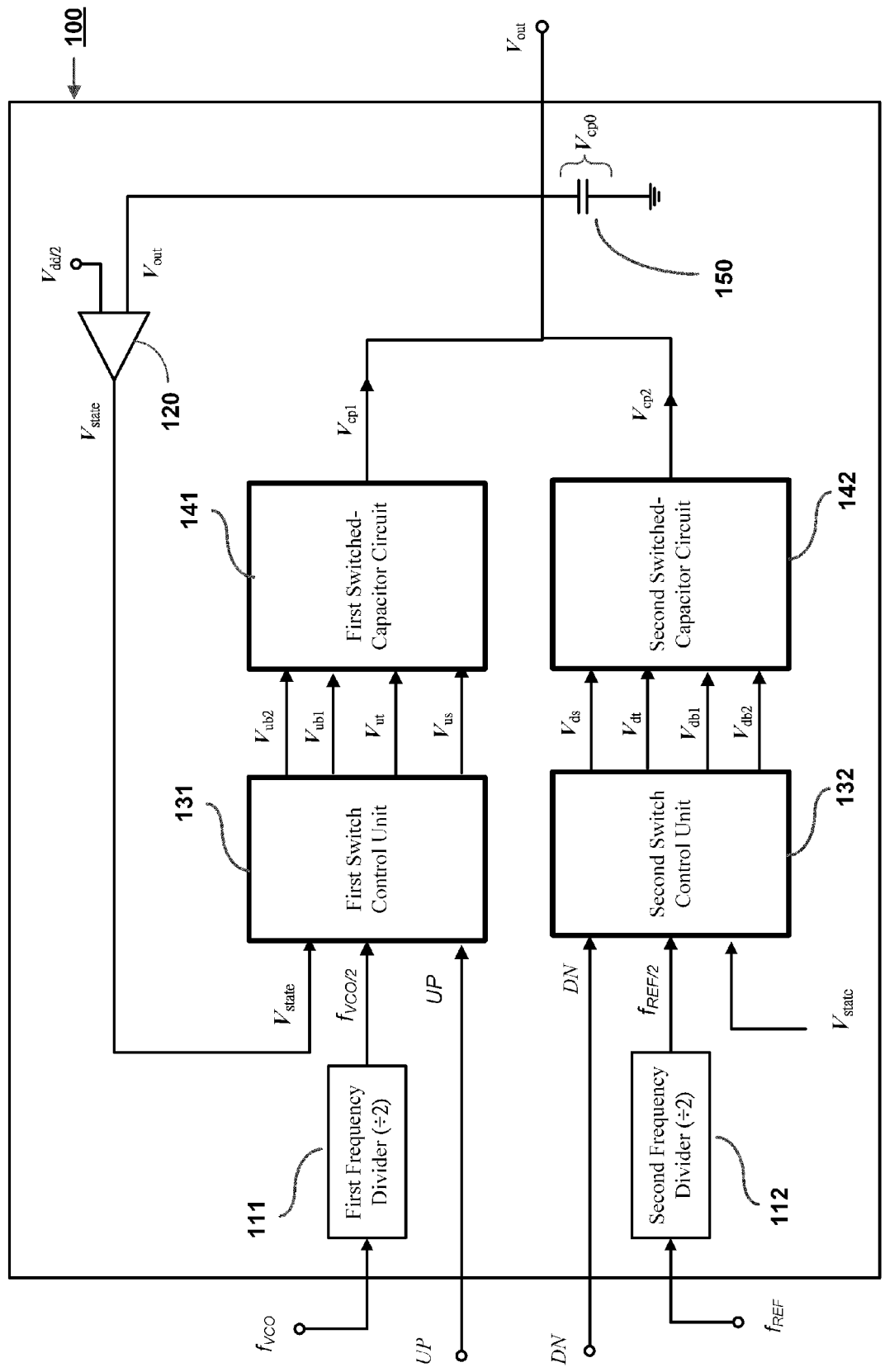
FIG. 3 is a schematic diagram showing the circuit architecture of the switched-capacitor charge pump device of the invention.

As shown in FIG. 3, in circuit architecture, the switched-capacitor charge pump device of the invention 100 comprises: (A) a first frequency divider 111 and a second frequency divider 112; (B) an output voltage comparing circuit 120; (C) a first switch control unit 131 and a second switch control unit 132; (D) a first switched-capacitor circuit 141 and a second switched-capacitor circuit 142; and (E) an output capacitor circuit 150. Firstly, the respective attributes and functions of these constituent circuit components of the invention are described in details in the following.

First Frequency Divider 111 and Second Frequency Divider 112

The first frequency divider 111 is capable of performing a divide-by-2 frequency dividing operation on the oscillating signal $f_{VCO}$ to thereby generate an output of a half-frequency oscillating signal (which is expressed as $f_{VCO/2}$). The output half-frequency oscillating signal $f_{VCO/2}$ is then transferred to the first switch control unit 131.

In a similar manner, the second frequency divider 112 is capable of performing a divide-by-2 frequency dividing operation on the reference signal $f_{REF}$ to thereby generate an output of a half-frequency reference signal (which is expressed as $f_{REF/2}$). The output half-frequency reference signal $f_{REF/2}$ is then transferred to the second switch control unit 132.

Output Voltage Comparing Circuit 120

The output voltage comparing circuit 120 is capable of comparing the output DC voltage $V_{out}$ of the switched-capacitor charge pump device of the invention 100 against a half-amplitude drive voltage $V_{dd/2}$. If $V_{out} < V_{dd/2}$, the output voltage comparing circuit 120 will generate a logic-LOW voltage output (i.e., $V_{state}$=LOW); and whereas if $V_{out} \geq V_{dd/2}$, the output voltage comparing circuit 120 will generate a logic-HIGH voltage output (i.e., $V_{state}$=HIGH). The output voltage $V_{state}$ is used as a drive-voltage switching enable signal and concurrently transferred to both the first switch control unit 131 and the second switch control unit 132.

In practice, for example, the output voltage comparing circuit 120 can be implemented with a Schmitt trigger or an analog comparator. However, since the Schmitt trigger is capable of low-noise operation, it is more preferable for use than the analog comparator.

First Switch Control Unit 131 and Second Switch Control Unit 132

The first switch control unit 131 has an input interface for reception of 3 input signals (UP, $f_{VCO/2}$, $V_{state}$) and an output interface for generation of a first set of switch control signals ($V_{ub2}$, $V_{ub1}$, $V_{ut}$, $V_{us}$). These switch control signals ($V_{ub2}$, $V_{ub1}$, $V_{ut}$, $V_{us}$) are then transferred to the first switched-capacitor circuit 141.

In a similar manner, the second switched-capacitor circuit 142 has an input interface for reception of 3 input signals (DN, $f_{REF/2}$, $V_{state}$) and an output interface for generation of a second set of switch control signals ($V_{db2}$, $V_{db1}$, $V_{dt}$, $V_{ds}$). These switch control signals ($V_{db2}$, $V_{db1}$, $V_{dt}$, $V_{ds}$) are then transferred to the second switched-capacitor circuit 142.

Figure 4:
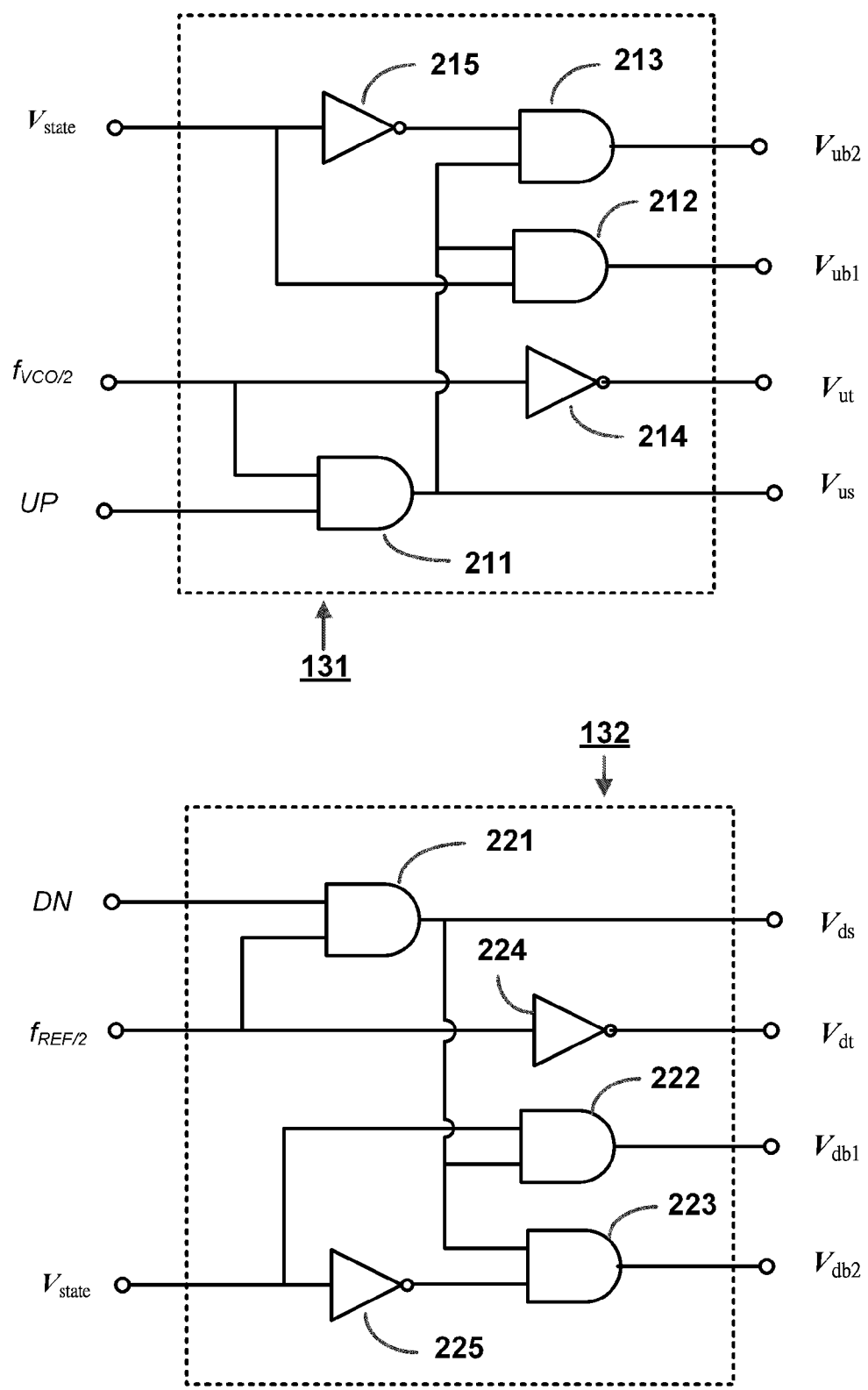
FIG. 4 is a schematic diagram showing the internal circuit architecture of a first switch control unit and a second switch control unit used to construct the switched-capacitor charge pump device of the invention.

In practice, for example, as shown in FIG. 4, the first switch control unit 131 can be implemented with a logic circuit which is composed of three AND gates 211, 212, 213 and two inverters 214, 215; while the second switch control unit 132 can be implemented with a similar logic circuit which is also composed of three AND gates 221, 222, 223 and two inverters 224, 225 which are arranged in a symmetrical manner with respect to the first switch control unit 131.

Figure 6A:
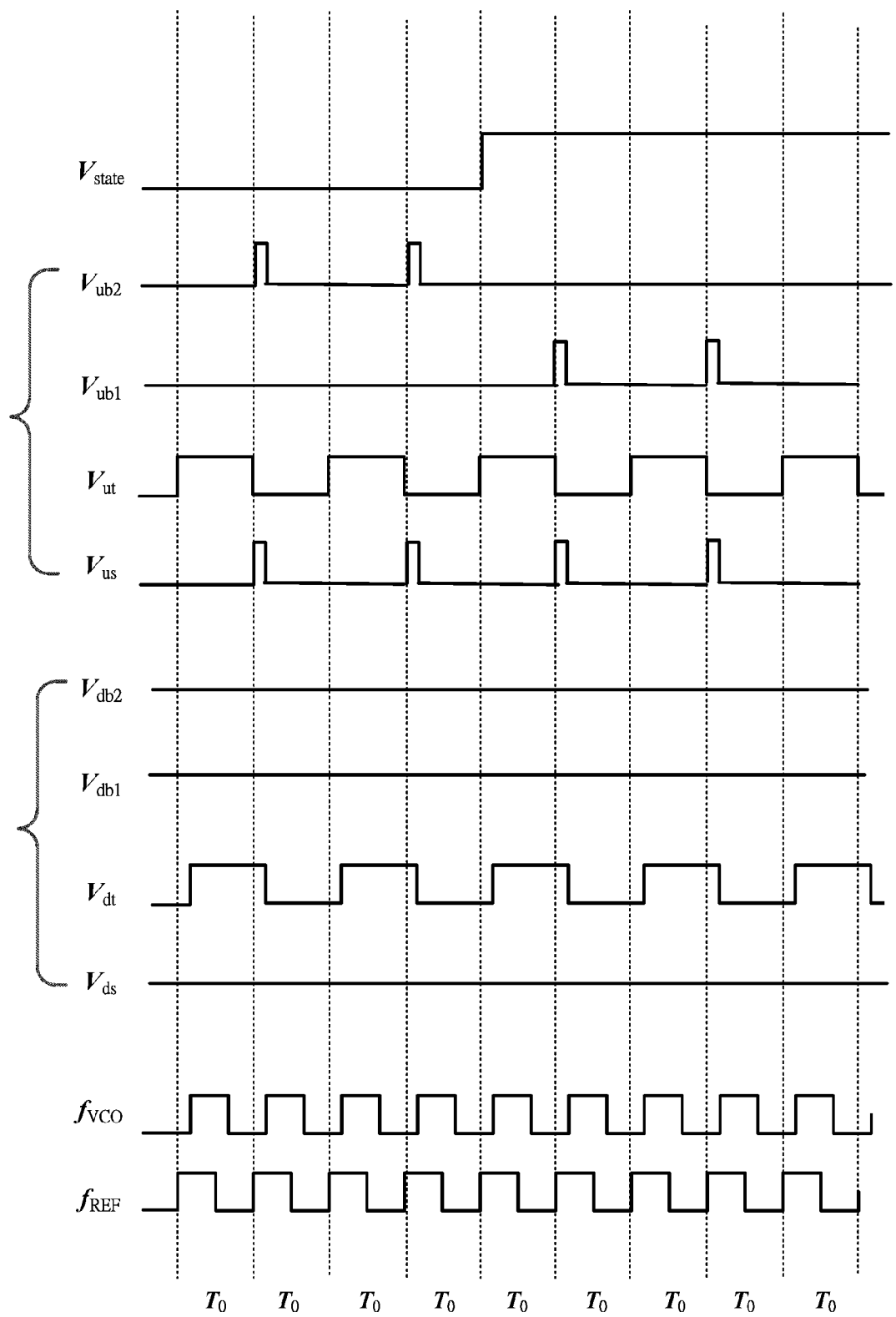
FIG. 6A is a signal diagram showing the waveforms and sequencing of a set of switch control signals under the condition of a phase lag in $f_{VCO}$ against $f_{REF}$.
Figure 6B:
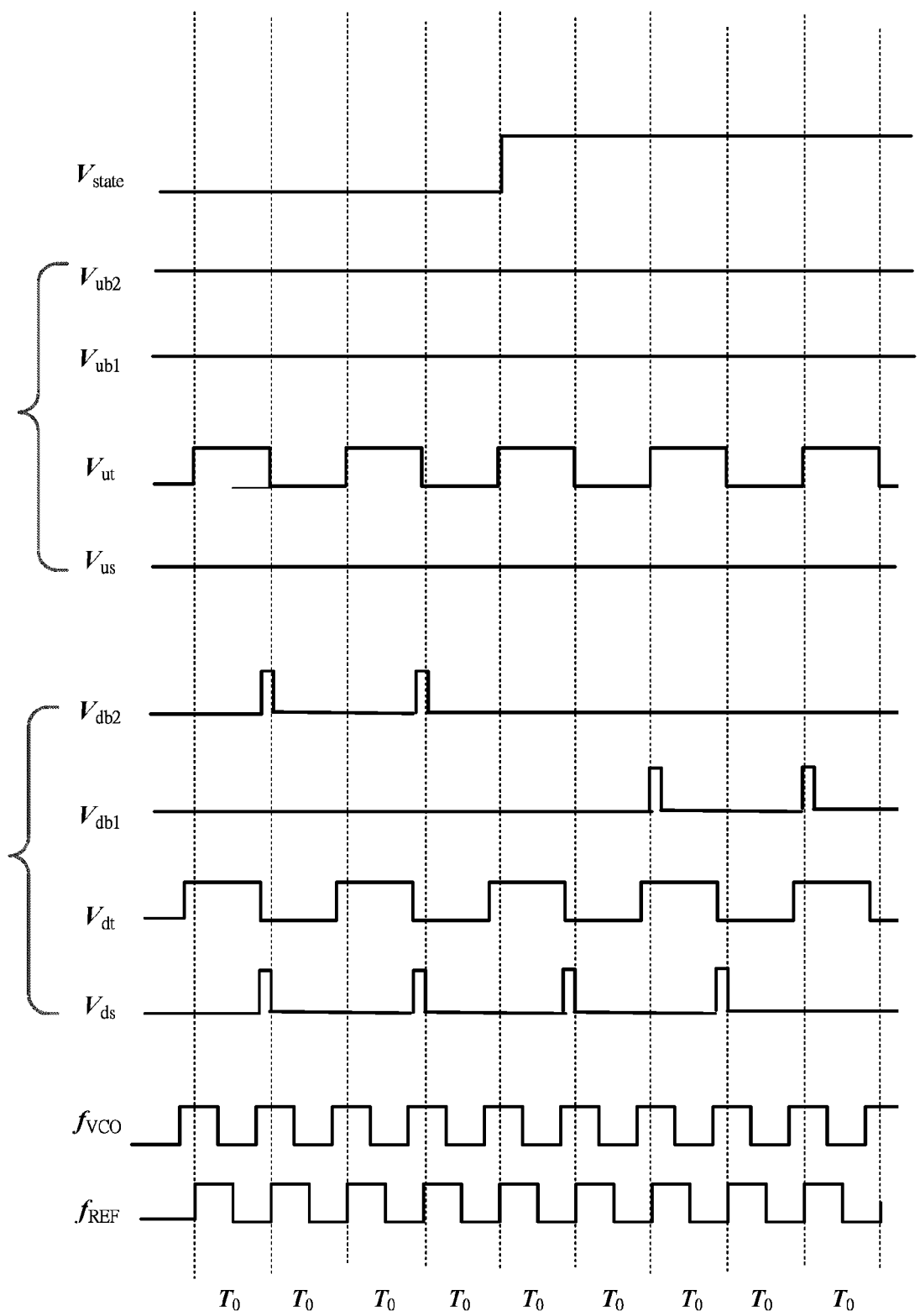
FIG. 6B is a signal diagram showing the waveforms and sequencing of a set of switch control signals under the condition of a phase lead in $f_{VCO}$ against $f_{REF}$.

FIG. 6A shows the waveforms and sequencing of ($V_{ub2}$, $V_{ub1}$, $V_{ut}$, $V_{us}$) and ($V_{db2}$, $V_{db1}$, $V_{dt}$, $V_{ds}$) with respect to ($f_{VCO}$, $f_{REF}$, $V_{state}$) under the condition of $f_{VCO}$ lagging in phase against $f_{REF}$; while FIG. 6B shows their waveforms and sequencing under the condition of $f_{VCO}$ leading in phase against $f_{REF}$.

As shown in FIG. 6A, it is assumed that $f_{VCO}$ lags in phase against $f_{REF}$ by a phase difference of ΔP. In this case, it will cause the switching control signals ($V_{ub2}$, $V_{ub1}$, $V_{ut}$, $V_{us}$) to act as follows: (1) $V_{ut}$ becomes a periodic pulse train with a pulse width of $T_0$ and a period of $2*T_0$; (2) $V_{us}$ becomes a periodic pulse train with a pulse width of ΔP and a period of $2*T_0$, and with each pulse having a rising edge in synchronization with the falling edge of one pulse in $V_{ut}$; (3) $V_{ub2}$ becomes a periodic pulse train which appears only during the time period when ($V_{state}$=LOW), with a pulse width of $\Delta P$ and a period of $2*T_0$, and with each pulse being in synchronization with one pulse in $V_{us}$; and (4) $V_{ub1}$ becomes a periodic pulse train which appears only during the time period when ($V_{state}$=HIGH), with a pulse width of $\Delta P$ and a period of $2*T_0$, and with each pulse being in synchronization with one pulse in $V_{us}$.

Further, as also shown in FIG. 6A, for the second set of switch control signals ($V_{db2}$, $V_{db1}$, $V_{dt}$, $V_{ds}$), the lagging of $f_{VCO}$ will cause $V_{dt}$ to become a periodic pulse train with a pulse width of $T_0$ and a period of $2*T_0$, and with a phase lag of $\Delta P$ with respect to $f_{REF}$. Beside $V_{dt}$, all the other three switch control signals ($V_{db2}$, $V_{db1}$, $V_{ds}$) remain in logic-LOW state.

As further shown in FIG. 6B, under the condition of $f_{VCO}$ leading in phase against $f_{REF}$, the waveforms and sequencing of ($V_{ub2}$, $V_{ub1}$, $V_{ut}$, $V_{us}$) and ($V_{db2}$, $V_{db1}$, $V_{dt}$, $V_{ds}$) with respect to ($f_{VCO}$, $f_{REF}$, $V_{state}$) are similar to that shown in FIG. 6A except in a reversed manner.

First Switched-Capacitor Circuit 141

Figure 5:
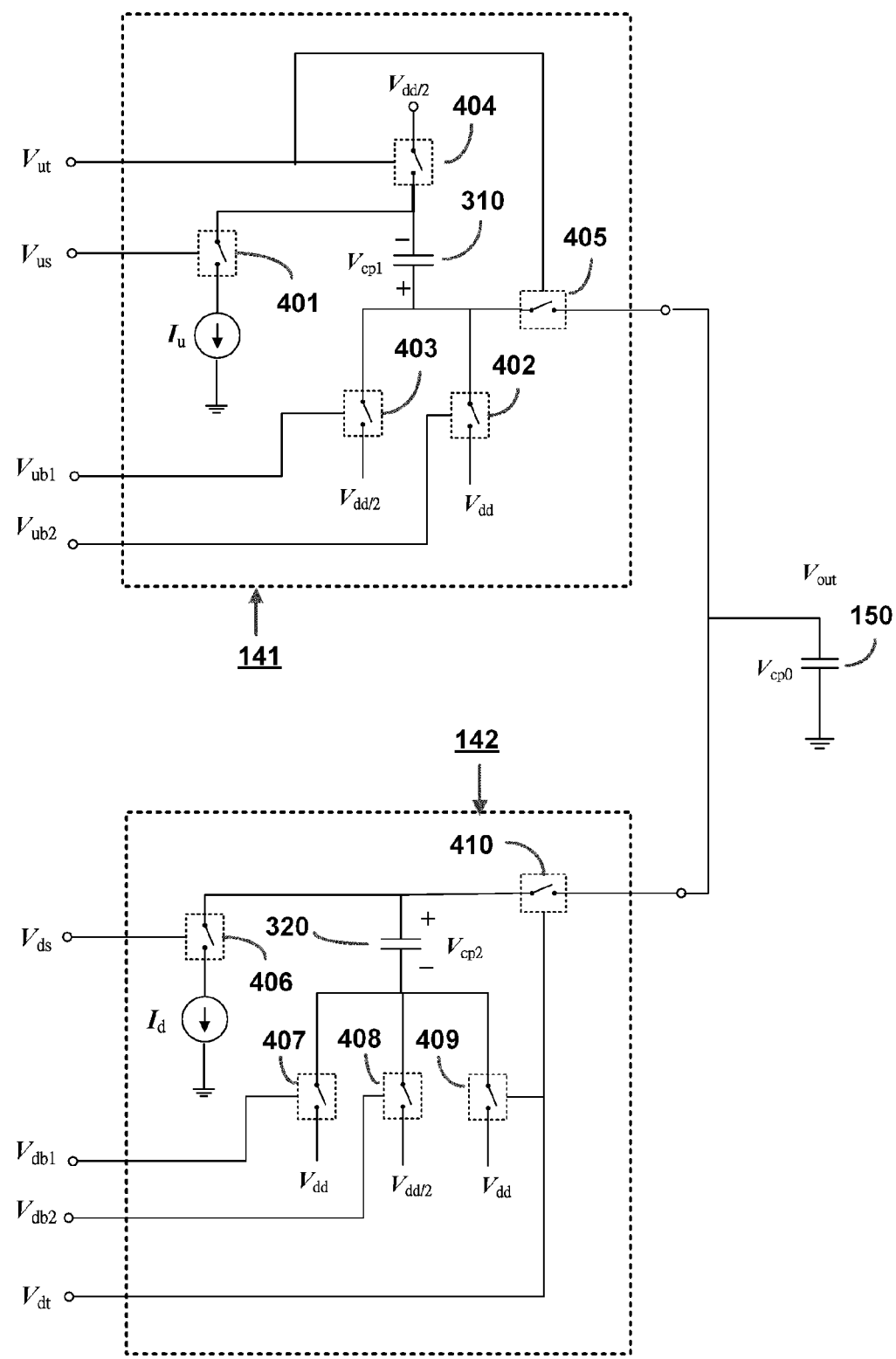
FIG. 5 is a schematic diagram showing the internal circuit architecture of a first switched-capacitor circuit and a second switched-capacitor circuit used to construct the switched-capacitor charge pump device of the invention.

As shown in FIG. 5, the first switched-capacitor circuit 141 is composed of a first capacitor 310 and a first switch array including a first switch 401, a second switch 402, a third switch 403, a fourth switch 404, and a fifth switch 405. The connection and operation of each of these switches 401, 402, 403, 404, 405 are described below.

The first switch 401 is capable of being activated by $V_{us}$ (when $V_{us}$=HIGH) for performing a switching operation to connect the negative polarity (−) of the first capacitor 310 to a first current source $I_u$, so that the first current source $I_u$ can render a discharging operation on the first capacitor 310.

The second switch 402 is capable of being activated by $V_{ub2}$ (when $V_{ub2}$=HIGH) for performing a switching operation to connect the positive polarity (+) of the first capacitor 310 to a full-amplitude drive voltage $V_{dd}$, so that the first capacitor 310 can be charged by $V_{dd}$ from the positive polarity (+).

The third switch 403 is capable of being activated by $V_{ub1}$ (when $V_{ub1}$=HIGH) for performing a switching operation to connect the positive polarity (+) of the first capacitor 310 to a half-amplitude drive voltage $V_{dd/2}$ (i.e., the amplitude of $V_{dd/2}$ is half of $V_{dd}$), so that the first capacitor 310 can be charged by $V_{dd/2}$ from the positive polarity (+).

The fourth switch 404 is capable of being activated by $V_{ut}$ (when $V_{ut}$=HIGH) for performing a switching operation to connect the negative polarity (−) of the first capacitor 310 to the half-amplitude drive voltage $V_{dd/2}$, so that the first capacitor 310 can be charged by $V_{dd/2}$ from the negative polarity (−).

The fifth switch 405 is capable of being activated by $V_{ut}$ (when $V_{ut}$=HIGH) for performing a switching operation to connect the positive polarity (+) of the first capacitor 310 to the output capacitor circuit 150, so that the capacitive voltage $V_{cp1}$ on the first capacitor 310 can be transferred to the output capacitor circuit 150.

Second Switched-Capacitor Circuit 142

Furthermore, also shown in FIG. 5, the second switched-capacitor circuit 142 is composed of a second capacitor 320 and a second switch array including a sixth switch 406, a seventh switch 407, an eighth switch 408, a ninth switch 409, and a tenth switch 410. The connection and operation of each of these switches 406, 407, 408, 409, 410 are described below.

The sixth switch 406 is capable of being activated by $V_{ds}$ (when $V_{ds}$=HIGH) for performing a switching operation to connect the positive polarity (+) of the second capacitor 320 to a second current source $I_d$, so that the second current source $I_d$ can render a discharging operation on the second capacitor 320.

The seventh switch 407 is capable of being activated by $V_{db1}$ (when $V_{db1}$=HIGH) for performing a switching operation to connect the negative polarity (−) of the second capacitor 320 to the full-amplitude drive voltage $V_{dd}$, so that the second capacitor 320 can be charged by $V_{dd}$ from the negative polarity (−).

The eighth switch 408 is capable of being activated by $V_{db2}$ (when $V_{db2}$=HIGH) for performing a switching operation to connect the negative polarity (−) of the second capacitor 320 to the half-amplitude drive voltage $V_{dd/2}$, so that the second capacitor 320 can be charged by $V_{dd/2}$ from the negative polarity (−).

The ninth switch 409 is capable of being activated by $V_{dt}$ (when $V_{dt}$=HIGH) for performing a switching operation to connect the negative polarity (−) of the second capacitor 320 to the half-amplitude drive voltage $V_{dd/2}$, so that the second capacitor 320 can be charged by $V_{dd/2}$ from the negative polarity (−).

The tenth switch 410 is capable of being activated by $V_{dt}$ (when $V_{dt}$=HIGH) for performing a switching operation to connect the positive polarity (+) of the second capacitor 320 to the output capacitor circuit 150, so that the capacitive voltage $V_{cp2}$ on the second capacitor 320 can be transferred to the output capacitor circuit 150.

In practice, for example, since the first current source $I_u$ and the second current source $I_d$ are both used for discharging purpose, i.e., the current of $I_u$ and the current of $I_d$ both flow to the ground GND, they can be realized by using MOS transistor circuit architectures of the same size and type, i.e., both realized by using NMOS-based circuit architecture or PMOS-based circuit architecture. This feature can be used to prevent the problem of a mismatch in electrical characteristics in conventional charge pump circuitry due to the use of both a PMOS-based current source and an NMOS-based current source in the same charge pump circuitry.

Output Capacitor Circuit 150

The output capacitor circuit 150 has one end connected to the output port ($V_{out}$) and the other end connected to the ground GND, and which operates on a switched reception of $V_{cp1}$ from the first switched-capacitor circuit 141 and $V_{cp2}$ from the second switched-capacitor circuit 142 to thereby generate a capacitive voltage $V_{cp0}$ which is used to serve as the output DC voltage $V_{out}$ of the switched-capacitor charge pump device of the invention 100, i.e., $V_{out}$=$V_{cp0}$.

OPERATION OF THE INVENTION

The following is a detailed description of a practical application example of the switched-capacitor charge pump device of the invention 100 during actual operation for providing an output DC voltage with a wider amplitude range compared to the prior art.

In the following example of the operation of the invention, it is assumed that $f_{VCO}$ lags in phase against $f_{REF}$ as illustrated in FIG. 6A.

Under the condition of a phase lag in $f_{VCO}$, the oscillating signal $f_{VCO}$ and the reference signal $f_{REF}$ are first processed respectively by the first frequency divider 111 and the second frequency divider 112 for divide-by-2 frequency dividing operation to thereby obtain $f_{VCO/2}$ and $f_{REF/2}$. This operation effectively double the pulse width of the original $f_{VCO}$ and $f_{REF}$. The half-frequency oscillating signal $f_{VCO/2}$ is then processed by the inverter 214 in the first switch control unit 131 to obtain an output of the switch control signal $V_{ut}$; and meanwhile, the half-frequency reference signal $f_{REF/2}$ is processed by the inverter 224 in the second switch control unit 132 to obtain an output of the switch control signal $V_{dt}$.

When ($V_{ut}$=HIGH), it activates the fourth switch 404 and the fifth switch 405 in the first switched-capacitor circuit 141 to be switched to conductive state, thereby connecting the positive polarity (+) of the first capacitor 310 concurrently to both the full-amplitude drive voltage $V_{dd}$ and the output capacitor circuit 150. During this time, when ($V_{dt}$=HIGH), it activates the ninth switch 409 and the tenth switch 410 in the second switched-capacitor circuit 142 to be switched to conductive state, thereby connecting the negative polarity (−) of the second capacitor 320 to $V_{dd}$ and meanwhile connecting the positive polarity (+) to the output capacitor circuit 150.

Subsequently, when ($V_{ut}$=LOW), it activates the first switch control unit 131 to switch both $V_{us}$ and $V_{ub2}$ to logic-HIGH state. Under the condition of ($V_{us}$, $V_{ub2}$)=(HIGH, HIGH), it activates a switching operation to connect the negative polarity (−) of the first capacitor 310 to the first current source $I_u$ and meanwhile connect the positive polarity (+) of the first capacitor 310 to $V_{dd}$.

The above switching actions result in a voltage pump-up operation on the output DC voltage $V_{out}$, which will continue under the condition of ($V_{state}$=LOW), i.e., $V_{out}<V_{dd/2}$, until $V_{state}$ is switched to logic-HIGH state, i.e., $V_{out} \geq V_{dd/2}$. Under the condition of ($V_{state}$=HIGH), $V_{ub2}$ presents no pulses; and instead, $V_{ub1}$ presents a sequence of logic-HIGH pulses at a period of $2*T_0$ and in synchronization with the pulses of $V_{us}$. Under the condition of ($V_{ub1}$=HIGH), it activates a switching operation to connect the positive polarity (+) of the first capacitor 310 to $V_{dd/2}$.

The above voltage pump-up operation on the output DC voltage $V_{out}$ will incessantly continue until $f_{VCO}$ is matched in phase with $f_{REF}$.

On the other hand, under the condition of a phase lead of $f_{VCO}$ against $f_{REF}$, a voltage pump-down operation is performed by using the switch control signals shown in FIG. 6B to change $f_{VCO}$ into phase match with $f_{REF}$. The voltage pump-down operation is performed substantially in a reversed manner as the voltage pump-up operation described above.

PERFORMANCE OF THE INVENTION

Figure 7A:
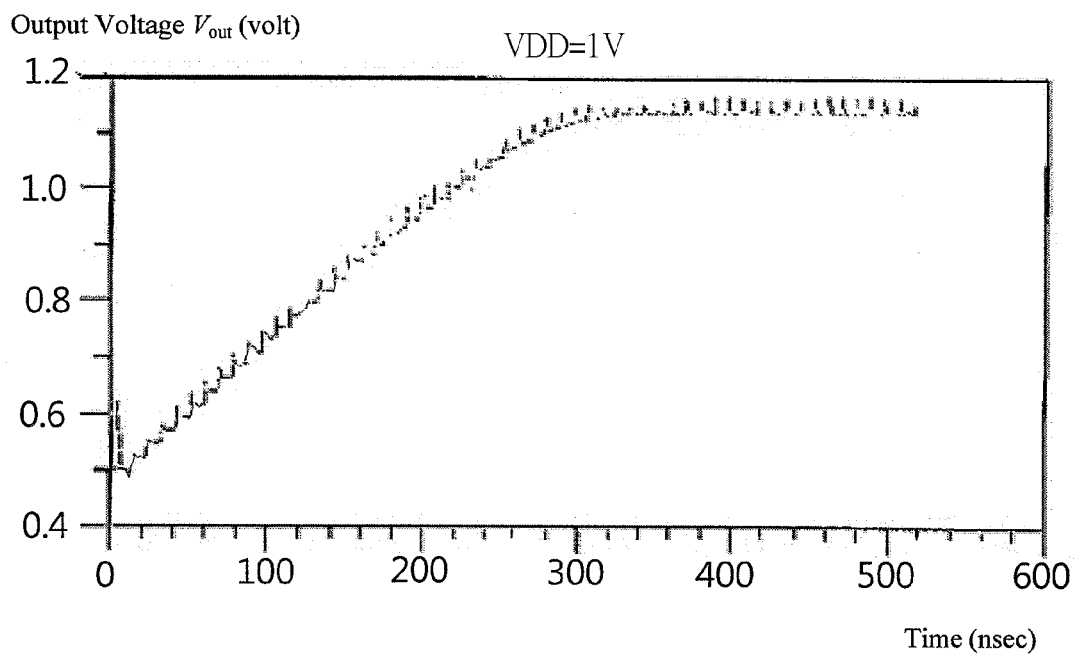
FIG. 7A is a graph showing a plot of $V_{out}$ versus time during a charging operation which is resulted from a circuit simulation on the invention.
Figure 7B:
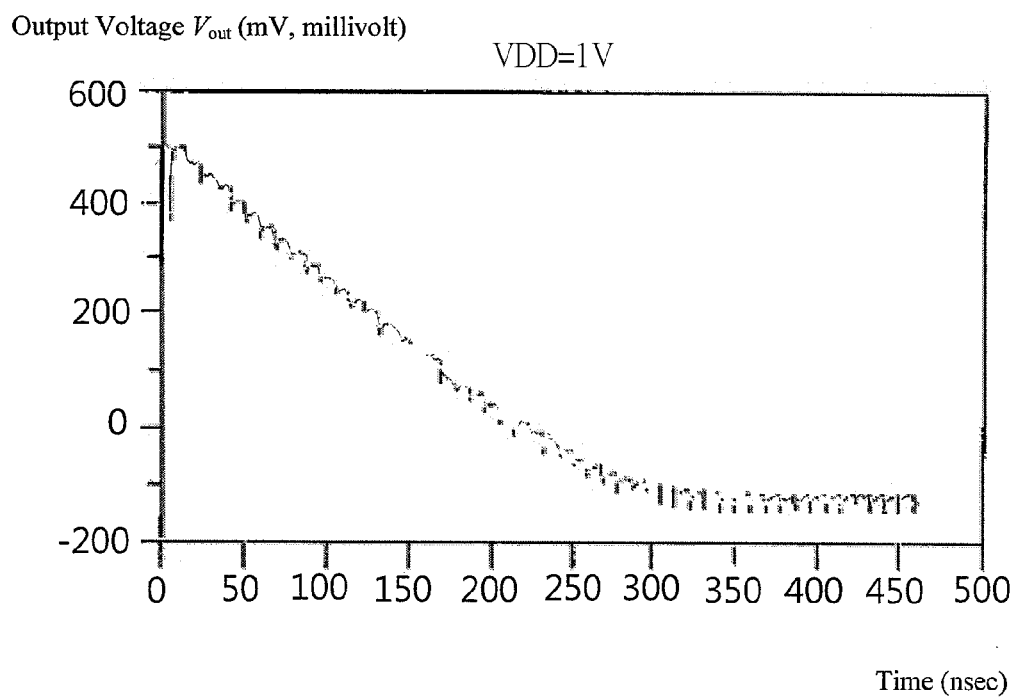
FIG. 7B is a graph showing a plot of $V_{out}$ versus time during a discharging operation which is resulted from a circuit simulation on the invention.

FIGS. 7A-7B are graphs showing the output characteristics of $V_{out}$ under the condition of $V_{dd}$=1 V (volt) resulted from a circuit simulation on the invention; wherein FIG. 7A shows a characteristic plot of $V_{out}$ versus time during a charging operation; while FIG. 7B shows a characteristic plot of $V_{out}$ versus time during a discharging operation.

It can be seen from FIGS. 7A-7B that $V_{out}$ can reach a maximum amplitude of about +1.1 V during the charging operation, and a minimum amplitude of about −0.1 V during the discharging operation. In other words, under the condition of $V_{dd}$=1 V, the invention is capable of providing an output DC voltage $V_{out}$ in the amplitude range from −0.1 V to +1.1 V, i.e., an amplitude span of 1.2 V, which is significantly larger than the amplitude span of 0.4 V provided by the prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A switched-capacitor charge pump device for integration to a circuit system of the type having a phase detector capable of generating an output of a pump-up enable signal and a pump-down enable signal representative of a phase difference between an oscillating signal and a reference signal for generating an output direct-current (DC) voltage in response to the pump-up enable signal and the pump-down enable signal from the phase detector;

the switched-capacitor charge pump device comprising:
a first frequency divider, which is capable of performing a divide-by-2 frequency dividing operation on the oscillating signal to thereby generate a half-frequency oscillating signal;
a second frequency divider, which is capable of performing a divide-by-2 frequency dividing operation on the reference signal to thereby generate a half-frequency reference signal;
an output voltage comparing circuit, which is capable of comparing the output DC voltage against a half-amplitude drive voltage to thereby generate a drive-voltage switching enable signal;
a first switch control unit, which is capable of generating a first set of switch control signals in response to the pump-up enable signal, the half-frequency oscillating signal, and the drive-voltage switching enable signal;
a second switch control unit, which is capable of generating a second set of switch control signals in response to the pump-down enable signal, the half-frequency reference signal, and the drive-voltage switching enable signal;
a first switched-capacitor circuit, which is composed of a first capacitor and a first switch array having a plurality of switches; wherein the first switch array is capable of being controlled by the first set of switch control signals from the first switch control unit by connecting the first capacitor in a predefined sequential order to a full-amplitude drive voltage, a half-amplitude drive voltage, a first current source, and an output port, such that the first capacitor is subjected to a switched charging-discharging operation to generate an output of a first capacitive voltage; and during the switched charging-discharging operation, the first switched-capacitor circuit is capable of responding to the drive-voltage switching enable signal from the output voltage comparing circuit by switching the first capacitor for connection to the half-amplitude drive voltage when the output DC voltage is lower than the half-amplitude drive voltage, and to the full-amplitude drive voltage when the output DC voltage is higher than the half-amplitude drive voltage;
a second switched-capacitor circuit, which is composed of a second capacitor and a second switch array having a plurality of switches; wherein the second switch array is capable of being controlled by the second set of switch control signals from the second switch control unit by connecting the second capacitor in a predefined sequential order to the full-amplitude drive voltage, the half-amplitude drive voltage, a second current source, and the output port, such that the second capacitor is subjected to a switched charging-discharging operation to generate an output of a second capacitive voltage; and during the switched charging-discharging operation, the second switched-capacitor circuit is capable of responding to the drive-voltage switching enable signal from the output voltage comparing circuit by switching the second capacitor for connection to the half-amplitude drive voltage when the output DC voltage is lower than the half-amplitude drive voltage, and to the full-amplitude drive voltage when the output DC voltage is higher than the half-amplitude drive voltage; and an output capacitor circuit, which is connected to the output port and capable of being switched for connection between the first capacitive voltage generated by the first switched-capacitor circuit and the second capacitive voltage generated by the second switched-capacitor circuit to generate a capacitive voltage which is used to serve as the output DC voltage of the switched-capacitor charge pump device.

2. The switched-capacitor charge pump device of claim 1, wherein the circuit system is a PLL (phase-locked loop) circuit system.

3. The switched-capacitor charge pump device of claim 1, wherein the circuit system is a DLL (delay-locked loop) circuit system.

4. The switched-capacitor charge pump device of claim 1, wherein the output voltage comparing circuit is a Schmitt trigger.

5. The switched-capacitor charge pump device of claim 1, wherein the output voltage comparing circuit is an analog comparator.

6. The switched-capacitor charge pump device of claim 1, wherein the first current source and the second current source respectively in the first switched-capacitor circuit and the second switched-capacitor circuit are realized by using MOS transistor circuit architectures of the same size and type.

7. The switched-capacitor charge pump device of claim 6, wherein the first current source and the second current source are each a PMOS-based current source.

8. The switched-capacitor charge pump device of claim 6, wherein the first current source and the second current source are each an NMOS-based current source.

9. A switched-capacitor charge pump device for integration to a PLL (phase-locked loop) circuit system of the type having a phase detector capable of generating an output of a pump-up enable signal and a pump-down enable signal representative of a phase difference between an oscillating signal and a reference signal for generating an output direct-current (DC) voltage in response to the pump-up enable signal and the pump-down enable signal from the phase detector;

the switched-capacitor charge pump device comprising:

a first frequency divider, which is capable of performing a divide-by-2 frequency dividing operation on the oscillating signal to thereby generate a half-frequency oscillating signal;

a second frequency divider, which is capable of performing a divide-by-2 frequency dividing operation on the reference signal to thereby generate a half-frequency reference signal;

an output voltage comparing circuit, which is capable of comparing the output DC voltage against a half-amplitude drive voltage to thereby generate a drive-voltage switching enable signal;

a first switch control unit, which is capable of generating a first set of switch control signals in response to the pump-up enable signal, the half-frequency oscillating signal, and the drive-voltage switching enable signal;

a second switch control unit, which is capable of generating a second set of switch control signals in response to the pump-down enable signal, the half-frequency reference signal, and the drive-voltage switching enable signal;

a first switched-capacitor circuit, which is composed of a first capacitor and a first switch array having a plurality of switches; wherein the first switch array is capable of being controlled by the first set of switch control signals from the first switch control unit by connecting the first capacitor in a predefined sequential order to a full-amplitude drive voltage, a half-amplitude drive voltage, a first current source, and an output port, such that the first capacitor is subjected to a switched charging-discharging operation to generate an output of a first capacitive voltage; and during the switched charging-discharging operation, the first switched-capacitor circuit is capable of responding to the drive-voltage switching enable signal from the output voltage comparing circuit by switching the first capacitor for connection to the half-amplitude drive voltage when the output DC voltage is lower than the half-amplitude drive voltage, and to the full-amplitude drive voltage when the output DC voltage is higher than the half-amplitude drive voltage;

a second switched-capacitor circuit, which is composed of a second capacitor and a second switch array having a plurality of switches; wherein the second switch array is capable of being controlled by the second set of switch control signals from the second switch control unit by connecting the second capacitor in a predefined sequential order to the full-amplitude drive voltage, the half-amplitude drive voltage, a second current source, and the output port, such that the second capacitor is subjected to a switched charging-discharging operation to generate an output of a second capacitive voltage; and during the switched charging-discharging operation, the second switched-capacitor circuit is capable of responding to the drive-voltage switching enable signal from the output voltage comparing circuit by switching the second capacitor for connection to the half-amplitude drive voltage when the output DC voltage is lower than the half-amplitude drive voltage, and to the full-amplitude drive voltage when the output DC voltage is higher than the half-amplitude drive voltage; and an output capacitor circuit, which is connected to the output port and capable of being switched for connection between the first capacitive voltage generated by the first switched-capacitor circuit and the second capacitive voltage generated by the second switched-capacitor circuit to generate a capacitive voltage which is used to serve as the output DC voltage of the switched-capacitor charge pump device.

10. The switched-capacitor charge pump device of claim 9, wherein the output voltage comparing circuit is a Schmitt trigger.

11. The switched-capacitor charge pump device of claim 9, wherein the output voltage comparing circuit is an analog comparator.

12. The switched-capacitor charge pump device of claim 9, wherein the first current source and the second current source respectively in the first switched-capacitor circuit and the second switched-capacitor circuit are realized by using MOS transistor circuit architectures of the same size and type.

13. The switched-capacitor charge pump device of claim 12, wherein the first current source and the second current source are each a PMOS-based current source.

14. The switched-capacitor charge pump device of claim 12, wherein the first current source and the second current source are each an NMOS-based current source.

15. A switched-capacitor charge pump device for integration to a DLL (delay-locked loop) circuit system of the type having a phase detector capable of generating an output of a pump-up enable signal and a pump-down enable signal representative of a phase difference between an oscillating signal and a reference signal for generating an output direct-current (DC) voltage in response to the pump-up enable signal and the pump-down enable signal from the phase detector;

the switched-capacitor charge pump device comprising:

a first frequency divider, which is capable of performing a divide-by-2 frequency dividing operation on the oscillating signal to thereby generate a half-frequency oscillating signal;

a second frequency divider, which is capable of performing a divide-by-2 frequency dividing operation on the reference signal to thereby generate a half-frequency reference signal;

an output voltage comparing circuit, which is capable of comparing the output DC voltage against a half-amplitude drive voltage to thereby generate a drive-voltage switching enable signal;

a first switch control unit, which is capable of generating a first set of switch control signals in response to the pump-up enable signal, the half-frequency oscillating signal, and the drive-voltage switching enable signal;

a second switch control unit, which is capable of generating a second set of switch control signals in response to the pump-down enable signal, the half-frequency reference signal, and the drive-voltage switching enable signal;

a first switched-capacitor circuit, which is composed of a first capacitor and a first switch array having a plurality of switches; wherein the first switch array is capable of being controlled by the first set of switch control signals from the first switch control unit by connecting the first capacitor in a predefined sequential order to a full-amplitude drive voltage, a half-amplitude drive voltage, a first current source, and an output port, such that the first capacitor is subjected to a switched charging-discharging operation to generate an output of a first capacitive voltage; and during the switched charging-discharging operation, the first switched-capacitor circuit is capable of responding to the drive-voltage switching enable signal from the output voltage comparing circuit by switching the first capacitor for connection to the half-amplitude drive voltage when the output DC voltage is lower than the half-amplitude drive voltage, and to the full-amplitude drive voltage when the output DC voltage is higher than the half-amplitude drive voltage;

a second switched-capacitor circuit, which is composed of a second capacitor and a second switch array having a plurality of switches; wherein the second switch array is capable of being controlled by the second set of switch control signals from the second switch control unit by connecting the second capacitor in a predefined sequential order to the full-amplitude drive voltage, the half-amplitude drive voltage, a second current source, and the output port, such that the second capacitor is subjected to a switched charging-discharging operation to generate an output of a second capacitive voltage; and during the switched charging-discharging operation, the second switched-capacitor circuit is capable of responding to the drive-voltage switching enable signal from the output voltage comparing circuit by switching the second capacitor for connection to the half-amplitude drive voltage when the output DC voltage is lower than the half-amplitude drive voltage, and to the full-amplitude drive voltage when the output DC voltage is higher than the half-amplitude drive voltage; and an output capacitor circuit, which is connected to the output port and capable of being switched for connection between the first capacitive voltage generated by the first switched-capacitor circuit and the second capacitive voltage generated by the second switched-capacitor circuit to generate a capacitive voltage which is used to serve as the output DC voltage of the switched-capacitor charge pump device.

16. The switched-capacitor charge pump device of claim 15, wherein the output voltage comparing circuit is a Schmitt trigger.

17. The switched-capacitor charge pump device of claim 15, wherein the output voltage comparing circuit is an analog comparator.

18. The switched-capacitor charge pump device of claim 15, wherein the first current source and the second current source respectively in the first switched-capacitor circuit and the second switched-capacitor circuit are realized by using MOS transistor circuit architectures of the same size and type.

19. The switched-capacitor charge pump device of claim 18, wherein the first current source and the second current source are each a PMOS-based current source.

20. The switched-capacitor charge pump device of claim 18, wherein the first current source and the second current source are each an NMOS-based current source.

* * * * *